United States Patent [19]

Tabata et al.

[11] Patent Number: 4,979,195
[45] Date of Patent: Dec. 18, 1990

[54] VERTICAL STEPPER

[75] Inventors: Fumio Tabata, Yokohama; Hidenori Sekiguchi, Isehara; Toru Kamada; Yuji Sakata, both of Sagamihara, all of Japan

[73] Assignee: Fujitsu Limited, Kawasaki, Japan

[21] Appl. No.: 409,713

[22] Filed: Sep. 20, 1989

[30] Foreign Application Priority Data

Sep. 22, 1988 [JP] Japan .................................. 63-237807
Oct. 19, 1988 [JP] Japan .................................. 63-263184

[51] Int. Cl.$^5$ ........................ G21K 5/00; B23Q 1/04; B25B 1/22
[52] U.S. Cl. ...................................... 378/34; 378/35; 378/208; 269/73
[58] Field of Search ...................... 378/34, 35, 208; 269/73

[56] References Cited

U.S. PATENT DOCUMENTS

| | | | |
|---|---|---|---|
| 4,516,253 | 5/1985 | Novak | 250/491.1 |
| 4,525,852 | 6/1985 | Rosenberg | 378/34 |
| 4,766,465 | 8/1988 | Takahashi | 250/491.1 |
| 4,803,712 | 2/1989 | Kembo et al. | 250/492.2 |
| 4,803,713 | 2/1989 | Fujii | 378/34 |
| 4,823,012 | 4/1989 | Kosugi | 250/491.1 |
| 4,825,086 | 4/1989 | Mueller | 378/34 |
| 4,843,563 | 6/1989 | Takahashi et al. | 250/492.2 |
| 4,849,801 | 7/1989 | Shimizu | 250/491.1 |

Primary Examiner—Janice A. Howell
Assistant Examiner—Kim-Kwok Chu
Attorney, Agent, or Firm—Staas & Halsey

[57] ABSTRACT

A vertical stepper transfers a circuit pattern formed on a mask onto a wafer using synchrotron radiation instead of a light source. The vertical stepper includes a wafer stage for having the wafer mounted thereon in the vertical direction and a mask stage for having the mask mounted thereon in the vertical direction. The wafer stage includes a coarse X-Y stage, a transfer member, and a wafer mounting member. The wafer mounting member is provided with a fine X-Y stage. The wafer mounting member is moved in the horizontal direction between a first position mounted on the coarse X-Y stage and a second position mounted on the mask stage by the transfer member. When exposed to the synchrotron radiation, the wafer mounting member is integrated with the mask stage. After the wafer and the mask are strictly correctly positioned by the fine X-Y stage, the wafer mounting member, integrated with the mask stage, is stepped and repeat exposed by scanning in the vertical direction.

13 Claims, 14 Drawing Sheets

VERTICAL STEPPER

BACKGROUND OF THE INVENTION

This invention relates to a vertical stepper for transferring a circuit pattern formed on a mask by using synchrotron radiation (hereinafter simply referred to as "SR") as a light source.

In recent years, attention has been paid to an X-ray exposing method as means for manufacturing memory devices as VLSI of 16M bits or more which employs SR instead of a light source. This exposing method has features such as the wavelength of the light source is short and its parallel property is good compared with the conventional exposing method in which an ultraviolet (UV) ray is used. As a result this method is not only suitable to be used for transferring a submicron pattern of but also a high throughput can be expected because the strength of SR is large compared to UV radiation and thus exposure time is less.

As a conventional exposing device for VLSI, there has been known a horizontal stepper (reduced projection exposing device) using an ultraviolet ray. This horizontal stepper is designed such that a wafer and a mask are horizontally disposed at a predetermined space, and an ultraviolet ray is irradiated from a light source disposed above in order to transfer a circuit pattern formed on the mask onto the wafer in a reduced scale. However, such ultraviolet ray exposure type horizontal stepper has such disadvantage in that the wavelength of the ultraviolet ray is too long, it is not suitable to the exposure of a circuit pattern of submicron dimensions. This is the reason why the above-mentioned X-ray exposing method using SR instead of a light source draws much attention as means for manufacturing VLSI memories of 16M bits or more.

FIG. 1 illustrates a schematic view showing the principle of generating SR. Electrons accelerated by an accelerator (not shown) and made incident to a storage ring 1 are circulated within the vacuum storage ring 1 while being bent in orbit by a deflection magnet 2. A beam-like SR 3 is irradiated in the tangent direction from the portion of the storage ring 1 where the electron orbit is bent by the deflection magnet 2. Though this SR 3 includes a wide range of wavelengths of electromagnetic waves such as from an ultraviolet ray to an X-ray, an X-ray of a predetermined range of wavelengths is obtained by cutting such electromagnetic waves with other wavelengths by using mirrors, a Be-window, etc. (not shown) and the thus obtained X-ray is used for exposure.

By the way, in order to generate SR, it is necessary that electrons are accelerated from approximately several hundred MeV to approximately several GeV. In order to meet this requirement, the SR generator must be large in size compared to a UV lamp and therefore the SR generator must be horizontally installed. In this case, as SR is irradiated in the horizontal direction, a stepper using SR for exposure is necessarily of a vertical type wherein the mask and the wafer are vertically oriented.

Also, SR 3 has a rectangular shape in section elongated in the horizontal direction as shown in FIG. 2. Therefore, since a single scanning is not enough to cover the whole exposing area 4 on the mask, it is required to perform a vertical scanning wherein the mask and the wafer are integrally moved in the vertical direction during exposure. Furthermore, the whole surface of the wafer is required to be exposed by moving the wafer through a step-and-repeat action in the same manner as the conventional horizontal stepper wherein a visible ray, an ultraviolet ray, etc. are used as exposure radiation.

SUMMARY OF THE INVENTION

It is therefore an object of the present invention to provide a vertical stepper, in which a submicron circuit pattern is reliably transferred onto a wafer by means of exposure using SR irradiated in the horizontal direction.

Another object of the invention is to provide a vertical stepper, in which a three-dimensional relative position between the mask and the wafer can be strictly accurately aligned and a step-and-repeat action can be performed in a vertical plane.

A further object of the invention is to provide a vertical stepper, in which an occurrence of vertical displacement caused by gravity when the wafer is moved in the horizontal direction with respect to the mask is prevented.

In accordance with an aspect of the invention, there is provided a vertical stepper for transferring a circuit pattern formed on a mask onto a wafer by means of exposure using a synchrotron radiation source, said vertical stepper comprising a coarse X-Y stage for steppingly moving said wafer in the vertical and horizontal directions in a plane perpendicular to the irradiating direction of said synchrotron radiation; a mask stage having said mask mounted thereon such that said mask orients in a plane perpendicular to the irradiating direction and is moved for scanning in the vertical direction; scanning means for scanning said mask stage in the vertical direction; a wafer mounting member having said wafer mounted thereon such that said wafer orients in the perpendicular direction and is movable between a first position mounted on said coarse X-Y stage and a second position mounted on said mask stage, said wafer mounting member including a fine X-Y stage; transfer means for moving said wafer mounting member between said first and second positions; first suction means for vacuum drawing said wafer to said wafer mounting member; and second suction means for vacuum drawing said wafer mounting member to said mask stage.

Preferably, the mask stage includes a fine Z-$\theta$ stage for moving the mask in the irradiating direction of the synchrotron radiation and rotating the mask in a plane perpendicular to the irradiating direction of the synchrotron radiation.

As one preferred embodiment, the transfer means includes a transfer member, a plurality of guide pins mounted on the coarse X-Y stage and adapted to be engaged with the transfer member in order to guide the transfer member; air cylinder means one end of which is attached to the coarse X-Y stage and the other end of which is attached to the transfer member; and third suction means for selectively vacuum drawing the wafer mounting member.

Also, the fine X-Y stage includes a fine X-axis station which is moved in the X-axis direction, and a Y-axis station mounted on the fine X-axis station and movable in the Y-axis direction. The fine X-axis station includes a fine X-axis member movable in the X-axis direction, first parallel plate spring guides for supporting the fine X-axis member, and a first piezoelectric device disposed in such a manner as to displace the fine X-axis member in the X-axis direction. Similarly, the fine Y-axis station includes a fine Y-axis member movable in the Y-axis direction, second parallel plate spring guides for supporting the fine Y-axis member, and a second piezoelectric device disposed in such a manner as to displace the fine Y-axis member in the Y-axis direction.

Alternatively, the fine X-Y stage may comprise a fine X-Y member movable in the X-axis and Y-axis directions; first, second, third and fourth parallel plate spring guide means for supporting the fine X-Y member; and first and second piezoelectric devices disposed in such a manner as to displace the fine X-Y member in the X-axis and Y-axis directions, respectively.

The above and other objects, features and advantages of this invention and the manner of realizing them will become more apparent, and the invention itself will best be understood, from a study of the following description and appended claims, with reference had to the attached drawings showing some preferred embodiments of the invention.

BRIEF DESCRIPTION OF THE DRAWINGS

FIGS. 21A through 21C are explanatory views for explaining the wafer transfer steps, wherein FIG. 21A shows the wafer mounting member which is in a position away from the mask stage, FIG. 21B shows the wafer mounting member which is brought into intimate contact with the mask stage by the transfer mechanism, and FIG. 21C shows the wafer mounting member which is drawn or attracted by the mask stage and the transfer member which is returned to its original position.

DESCRIPTION OF THE PREFERRED EMBODIMENTS

Figure 3:
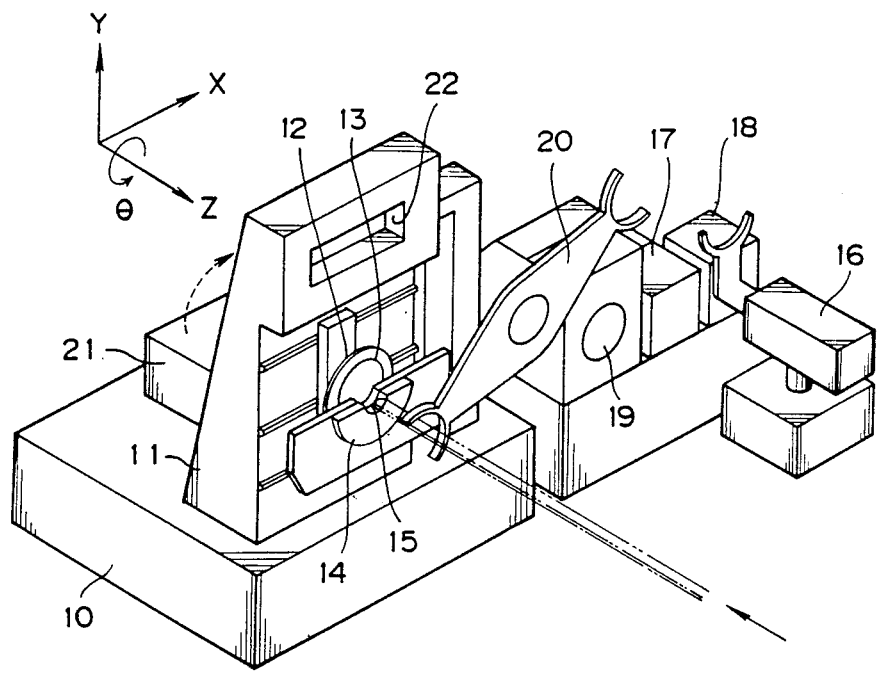
FIG. 3 is a perspective view showing the whole construction of a vertical stepper according to one embodiment of the present invention.

Referring to FIG. 3 first, a vertical stepper according to one embodiment of the present invention will be described briefly. Reference numeral 10 denotes a vibration isolating bed on which a support or column 11 is disposed. A wafer stage 12 is mounted on the column 11. The wafer stage 12 comprises a coarse X-Y stage and a fine X-Y stage as will be described hereinafter and has a degree of freedom in the X-axis and Y-axis indicated in the upper left of FIG. 3. The wafer stage 12 is provided with a wafer 13 and has a step-and-repeat function for effecting a transfer of a circuit pattern onto the whole wafer surface by means of exposure. With respect to the degree of freedom in a vertical (X-Y) plane, the wafer stage 12 includes a dead weight compensating mechanism as will be described hereinafter for offsetting the dead weight so that the dead weight of the wafer stage would not become a load to be incurred to an actuator.

Figure 1:
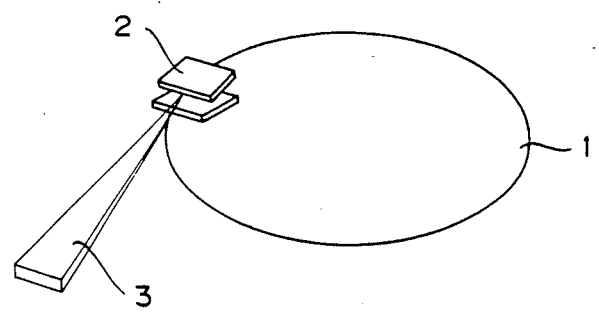
FIG. 1 is a schematic view for explaining the principle for generating SR.
Figure 2:
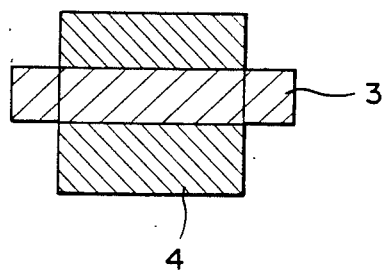
FIG. 2 is a schematic view showing the relation between an exposing area and SR.
Figure 4:
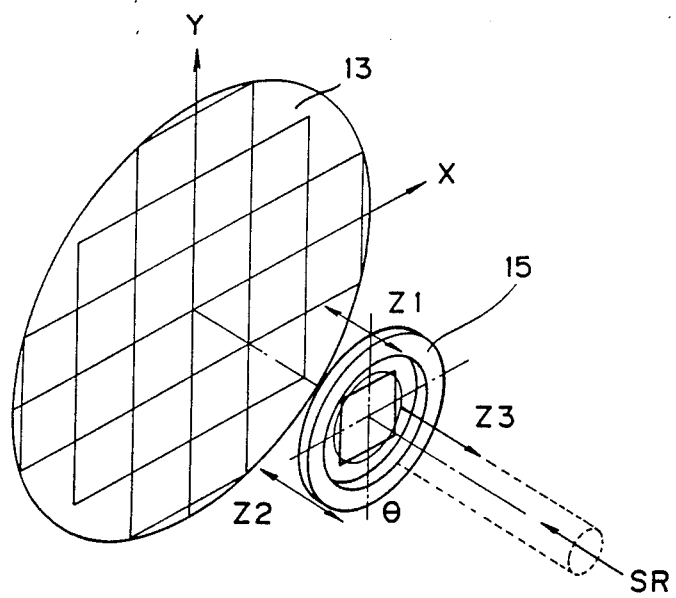
FIG. 4 is a schematic view showing the arrangement relation between a mask and a wafer and the degree of freedom for the mask and the wafer.

Reference numeral 14 denotes a mask stage which is provided with a mask 15 having a circuit pattern formed thereon and which has a degree of freedom in the Z-axis direction (see FIG. 4 illustrating parallel displacement in the Z-axis direction, rotation about the X-axis, and rotation about the Y-axis) in order to control a space between the mask stage 14 and the wafer 13 and its relative posture. The mask stage 14 also has a degree of freedom (that is, a degree of freedom in the θ-axis rotational direction) for correcting a relative rotational displacement with respect to the wafer 13. Further, the mask stage 14 includes a Y-axis direction SR beam scanning mechanism for moving the mask stage 14 in the vertical direction by fixing the relative position between the mask 14 and the wafer 13 by means of a method as will be described hereinafter in order to irradiate SR, which has a rectangular shape in section as shown in FIG. 2, to the whole surface of the mask 14. This mask stage 14 is also provided with a dead weight compensating mechanism adapted to offset the dead weight of the mask stage during the scanning movement.

Reference numeral 16 denotes a wafer loader which is a device for transferring the wafer 13 before exposure stocked in a wafer stocker 17 to a prealignment stage 19 by means of remote control. Reference numeral 18 denotes a wafer stocker for stocking a wafer after exposure. The prealignment stage 19 is a stage for automatically roughly performing an alignment of the wafer before the wafer 13 is mounted on the wafer stage 12 and has three degrees of freedom in the X-axis direction, Y-axis direction and θ-axis direction.

Reference numeral 20 denotes another wafer loader which is an arm type rotational mechanism capable of transferring a wafer, which has been roughly aligned by the prealignment stage 19, to the wafer stage 12 by means of remote control. Reference numeral 21 denotes a mask loader which is a device for transferring a mask selected from a plurality of masks stocked in a mask magazine (not shown) to the mask stage 14 lifted up to the uppermost position via an opening portion 22 formed in an upper portion of the column 11 by means of remote control.

Operation of the above-mentioned vertical stepper will be described briefly. The wafer 13, which is not yet subjected to exposure processing is taken out of the wafer stocker 17 by the wafer loader 16 and such taken-out wafer 13 is vacuum attracted or drawn onto the prealignment stage 19. After roughly aligning the wafer at this prealignment stage 19 by means of a method using an image processing or a photoelectric transducer such as a laser diode or the like, the wafer is transferred to the wafer stage 12 by the wafer loader 20 and the wafer 13 is vacuum attracted to the wafer stage 12. At this time, the mask stage 14 is already retreated to an upper position. Then, the wafer stage 12 is moved to the exposing position, and the mask stage 14 is lowered from its upper position until it is brought to be opposite the wafer stage 12. After the relative position between the wafer 13 and the mask 15 is strictly accurately aligned, SR is irradiated in order to transfer the circuit pattern formed on the mask 15 onto the wafer 13 by means of exposure.

The wafer stage 12 is steppingly moved in the X-axis and Y-axis directions to repeat the above-mentioned transferring operation. That is, by performing the step-and-repeat operation, the circuit pattern formed on the mask is transferred onto the whole surface of the wafer 13 by means of exposure. The wafer 13, which has been subjected to the exposing processing, is transferred to the wafer stocker 18 by the wafer loader 20 and stocked therein. By this, exposure of a sheet of wafer 13 is finished.

Next, in order to mount the mask 15 on the mask stage 14, the mask loader 21 withdraws a required mask from the mask magazine (not shown) and transfers it to the mask stage 14, which is already in its upper position, via the opening portion 22 as indicated by the dotted arrow. Then, after the mask stage 14 is lowered and correctly positioned, the mask 15 is fixed onto the mask stage 14 by means of vacuum suction.

Now each of the component parts which constitute the above-mentioned vertical stepper will be described hereinbelow.

Figure 5:
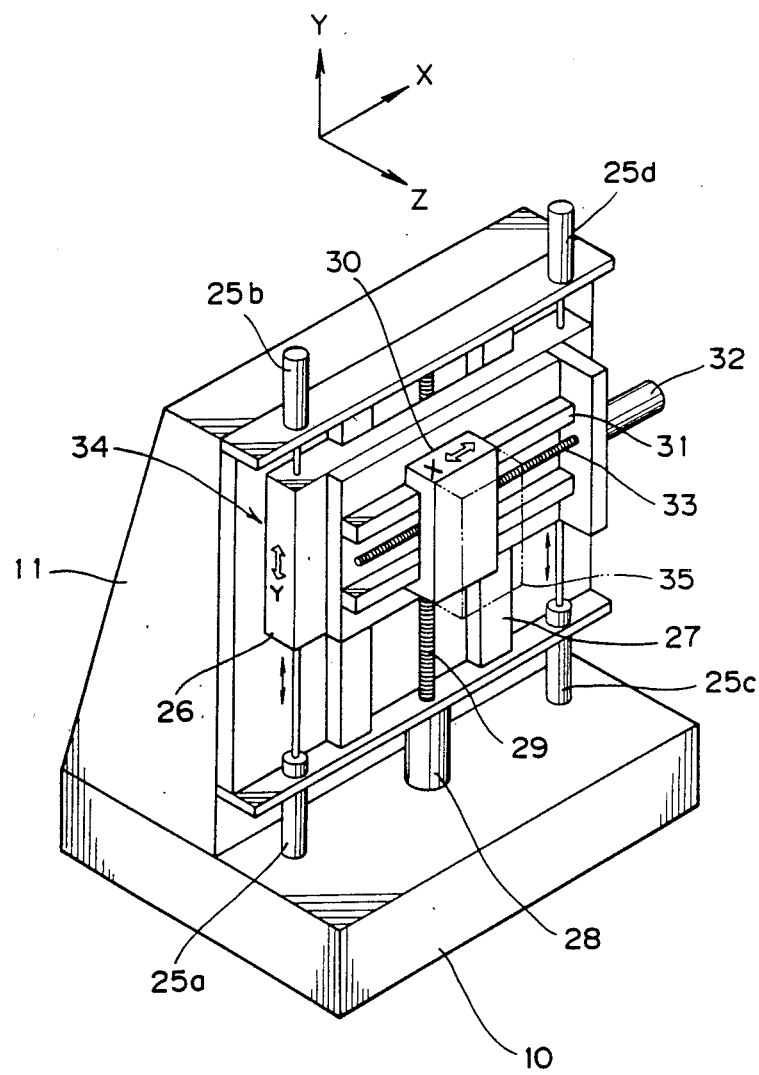
FIG. 5 is a perspective view showing the construction of a two-stage structure with one stage superposed on the other according to one embodiment of the present invention, wherein a fine X-Y stage is shown by the broken lines.

First, referring to FIG. 5 there will be described a wafer stage comprising a coarse X-Y stage and a fine X-Y stage superposed one upon the other to form a two-stage structure and a dead weight compensating mechanism thereof. The column 11 is provided with a Y-axis stage 26 which is guided by a pair of guide rails 27 in the vertical direction. This Y-axis stage 26 is moved in the vertical direction (Y-axis direction) by a driving mechanism comprising an actuator 28 and a ball screw 29. The Y-axis stage 26 is provided with an X-axis stage 30 which is guided in the horizontal direction (X-axis direction) by a pair of guide rails 31. The X-axis stage 30 is moved in the horizontal direction by a driving mechanism comprising an actuator 32 and a ball screw 33. In this specification, a stage comprising the Y-axis stage 26 and the X-axis stage 30 is referred to as a coarse X-Y stage 34. On the coarse X-Y stage 34, a fine X-Y stage 35, as will be described, is mounted as indicated by the broken line to form a two-stage structure.

Figure 6:
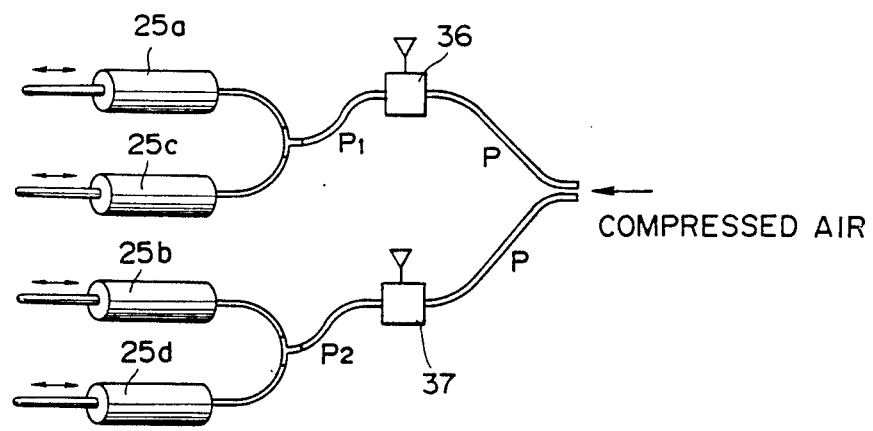
FIG. 6 is a schematic view showing the arrangement and the piping relation of dead weight compensating means shown in FIG. 5.

As illustrated, the coarse X-Y stage 34 is supported in such a manner as to be sandwiched by four air cylinders 25a through 25d. As shown in FIG. 6, the pressure P of compressed air is reduced to a pressure P1 by a pressure reducing valve 36 and fed to the air cylinders 25a and 25c, and is reduced to a pressure P2 by a pressure reducing valve 37 and then fed to the air cylinders 25b and 25d, respectively. The fine X-Y stage 35 as will be described is able to depart from the coarse X-Y stage 34. Therefore, when the fine X-Y stage 35 is away from the coarse X-Y stage 34, a differential pressure P1-P2 between the cylinders 25a and 25b and a differential pressure P1-P2 between the cylinders 25c and 25d are set as such that they are equal to a half of the dead weight of the coarse X-Y stage 34 so that the differential pressure is not changed even if the air pressure is changed and a stable dead weight compensation is always achieved. Further, when the fine X-Y stage 35 is mounted on the coarse X-Y stage 34, the pressure reducing valves 36 and 37 are controlled by a solenoid valve, etc. (not shown) such that the differential pressure P1-P2 is equal to a half of the total weight of both stage 34, 35. The air cylinders 25a through 25d stabilize a servo system of the wafer stage 12 comprising the coarse X-Y stage 34 and the fine X-Y stage 35 by damper effect of the air itself and the mass of the movable portion is not increased. The mass increase of the movable portion is a shortcoming inherent in a dead weight compensating mechanism using a counterweight.

The actuators 28 and 32 of the coarse X-Y stage 34, can each be a rotary type DC servo motor, a multipolar DC motor or the like. By means of a feed back control using a position detector such as a rotary encoder or the like, a micron order positioning can be realized. The position detector, may be a linear scale or a laser interferometer instead of a rotary encoder.

Figure 7:
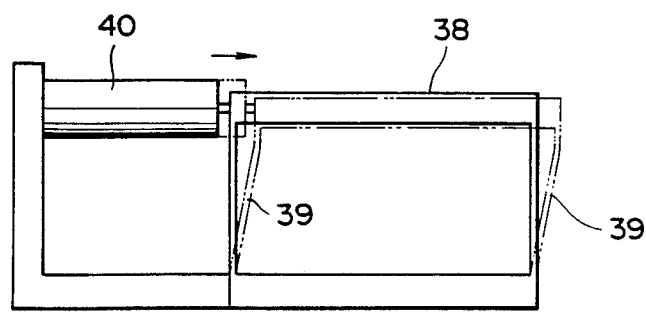
FIG. 7 is a schematic view of a single axis stage comprising a combination of parallel plate spring guides and a piezoelectric device.
Figure 8:
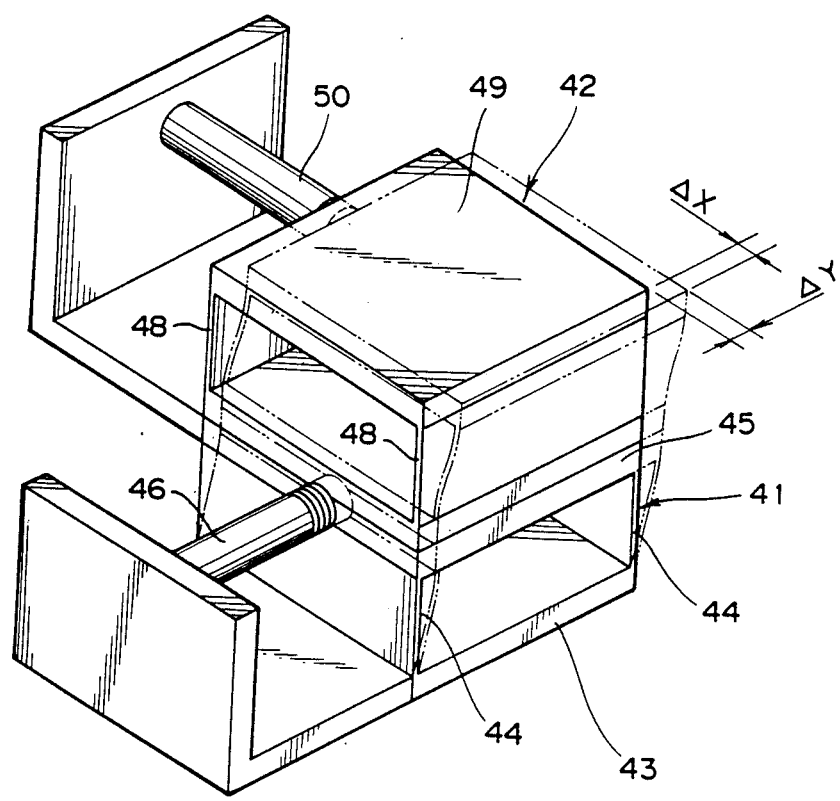
FIG. 8 is a schematic perspective view of the two-stage structure with one stage superposed on the other.

The X-Y stage 35 may comprise two single axis stages, each is constructed as shown in FIG. 7 in which a movable member 38 is supported by a pair of parallel plate spring guides 39 and a piezoelectric device 40 is used as an actuator. In order to form a two-stage structure, two single axis stages are superposed one upon the other as shown in FIG. 8. That is, the fine X-Y stage 35 comprises a fine Y-axis stage 41 and a fine X-axis stage 42 which is superposed on the Y-axis stage 41. The fine Y-axis stage 41 is designed such that a fine Y-axis member 45 is supported on a fixed member 43 by a pair of parallel plate spring guides 44, and a piezoelectric device 46 is disposed in such a manner as to displace the fine Y-axis member 45 in the Y-axis direction. Similarly, the fine X-axis stage 42 is designed such that a fine X-axis member 49 is supported on the fine Y-axis member 45 by a pair of parallel spring guides 48, and a piezoelectric device 50 is disposed in such a manner as to displace the fine X-axis member 49 in the X-axis direction.

By detecting the displaced amounts ΔX, ΔY of the fine X-axis member 49 using a high resolution position detector such as a laser interferometer, a differential transformer or the like and controlling the same to be fed back, a submicron order positioning can be effected. Of course, the Y-axis stage may be superposed on the X-axis stage.

Figure 9:
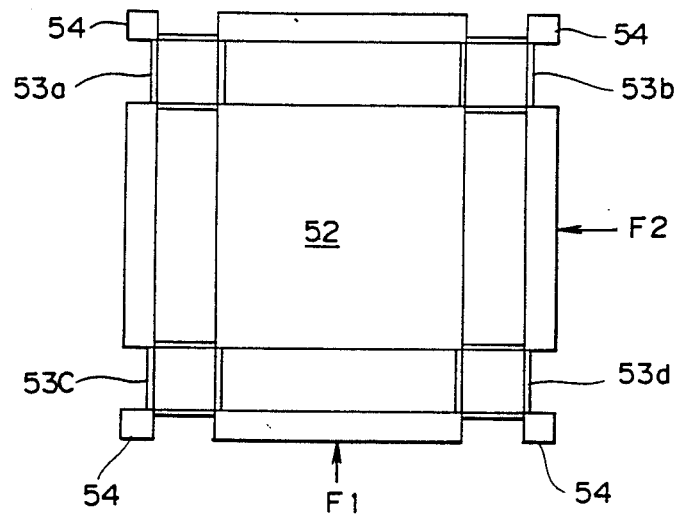
FIG. 9 is a view schematically showing the construction of an X-Y axis integral type fine X-Y stage.
Figure 10:
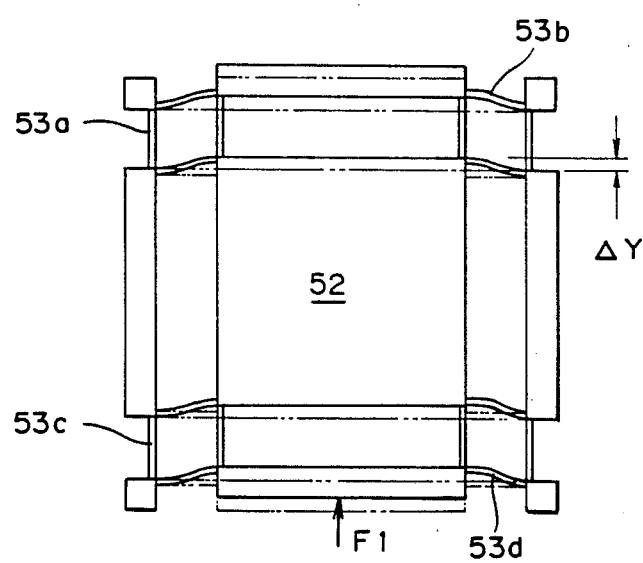
FIG. 10 is an explanatory view for explaining the action of FIG. 9.
Figure 11:
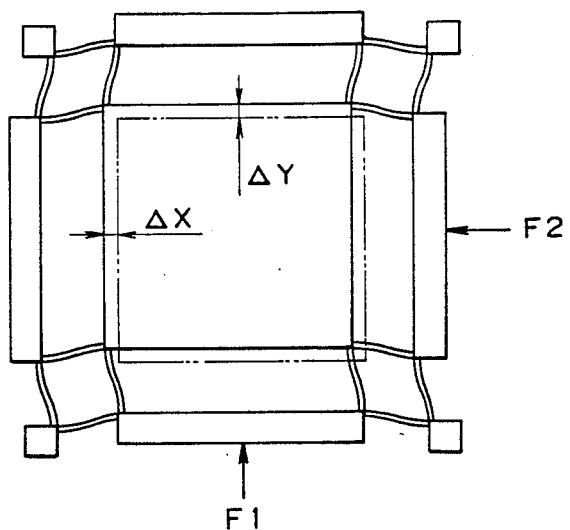
FIG. 11 is an operation explanatory view of FIG. 9 when the X-Y axis integral type fine X-Y stage is displaced in the X-axis and Y-axis directions simultaneously.

Referring to FIG. 9, there is illustrated a fine X-Y stage in which an XY-axes integral type guide mechanism is employed. A fine X-Y member 52 movable in the X-axis and Y-axis directions is supported by four parallel plate spring guiding means 53a through 53d each comprising a pair of parallel plate spring guides. A force F1 is applied to the fine X-Y member 52 by a first piezoelectric device (not shown) and a force F2 is applied thereto by a second piezoelectric device (not shown). Reference numeral 54 denotes a mounting portion of the fine X-Y stage with respect to the coarse X-Y stage or with respect to a wafer mounting member as will be described hereinafter. As shown in FIG. 10, when the force F1 is generated by the piezoelectric device, the fine X-Y member 52 is displaced by ΔY due to bending deformation of the parallel plate spring guiding means 53a through 53d. The same is applicable to the displacement in the X-axis direction. When the force F1 is applied in the Y-axis direction and the force F2 is applied in the X-axis direction, the fine X-Y member 52 is displaced in the manner as shown in FIG. 11.

The fine X-Y stage 35 can be separated away from the coarse X-Y stage 34 so that it can be vacuum drawn to the mask stage 14 at the time of SR exposure. By making the wafer stage into a two-stage structure in which the coarse X-Y stage 34 and the fine X-Y stage 35 are superposed one upon the other, a high speed step-and-repeat operation and an accurate positioning operation can be simultaneously realized.

Figure 12:
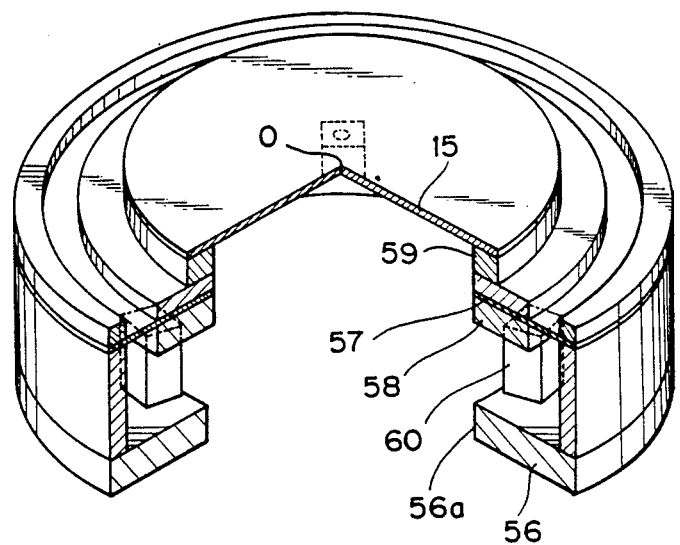
FIG. 12 is a perspective view, partly in section, of a mask stage according to one embodiment of the present invention.
Figure 13:
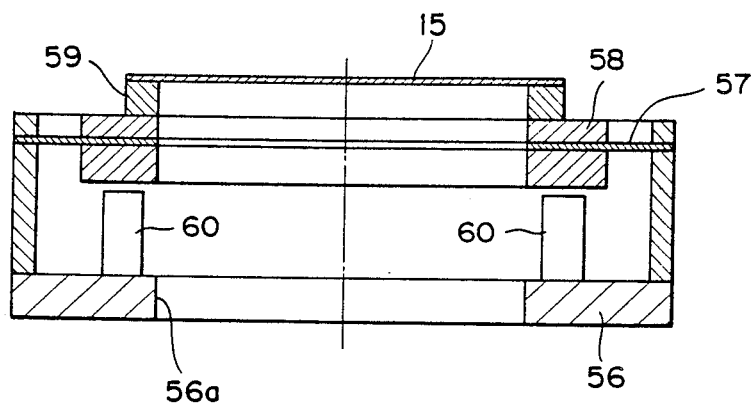
FIG. 13 is a sectional view of FIG. 12.
Figure 14:
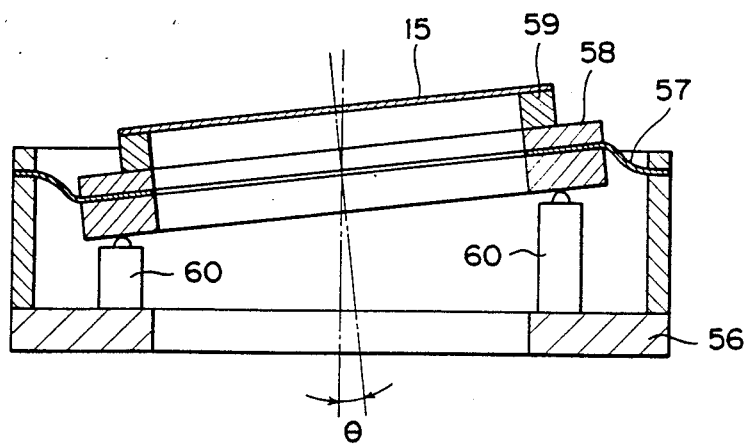
FIG. 14 is a view similar to FIG. 13 but showing the operating state of the piezoelectric device.

Next, referring to FIGS. 12 through 14, the construction of the mask stage 14 will be described. A ring-shaped movable member 58 is mounted onto a fixed member 56 having a circular opening portion 56a at its center by a ring-shaped diaphragm 57. The ring-shaped movable member 58 is provided thereon with a ring-shaped mask chuck 59, and the mask 15 is drawn and fixed by this mask chuch 59. Further, the movable member 58 is provided at three places on the circumference about the center 0 of the movable member 58 with piezoelectric devices 60 arranged at equal spaces. Through expanding and contracting motion of the piezoelectric devices 60, the distance and the relative inclination between the mask and the wafer can be corrected as shown in FIG. 14. In order to detect the position of the mask stage, it is preferable to use a differential transformer or a linear scale.

Figure 15:
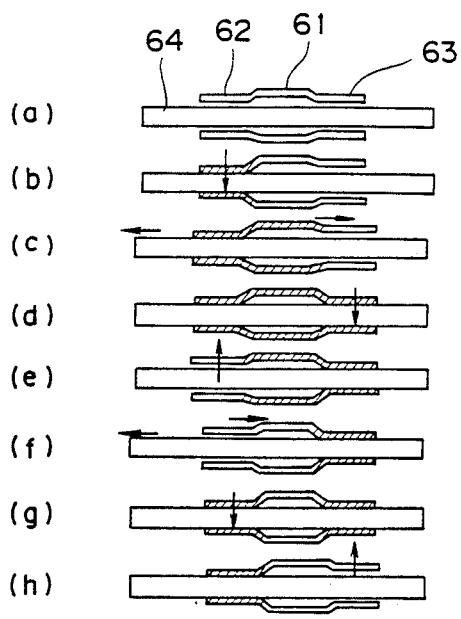
FIG. 15 is a schematic view for explaining the principle of the operation of a measuring worm type moving mechanism.

If the movable range of the piezoelectric device 60 is too small, the movable range may be enlarged by combining three piezoelectric devices so that it performs a measuring worm type motion as shown in FIG. 15. That is, in FIG. 15, an expanding and contracting piezoelectric device 61 is sandwiched by clamp piezoelectric devices 62 and 63, and the central portion of the expanding and contracting piezoelectric device 61 is fixed to a fixed member not shown. Reference numeral 64 denotes a movable member. In FIG. 15, (a) shows a state where all piezoelectric devices are turned off. And if the clamping piezoelectric device 62 is turned on as shown in (b) and then the expanding and contracting piezoelectric device 61 is expanded as shown in (c), as the expanding and contracting piezoelectric device 61 is fixed at its central portion, the movable member 64 is moved in the left-hand direction in the drawing. Then, if the clamp piezoelectric device 63 is turned on as shown in (d) and if the expanding and contracting piezoelectric device 61 is contracted as shown in (f) after the clamp piezoelectric device 62 is turned off as shown in (e), the movable member 64 is further moved in the left-hand direction because the central portion of the expanding and contracting piezoelectric device 61 is fixed. Then, if the clamping piezoelectric device 62 is turned on as shown in (g) and if the clamping piezoelectric device 63 is turned off as shown in (g), there can be obtained generally the same posture as shown in (b). Thereafter, by repeating each of the steps (b) through (h), the movable range of the movable member 64 can be enlarged by the measuring worm motion.

Figure 16:
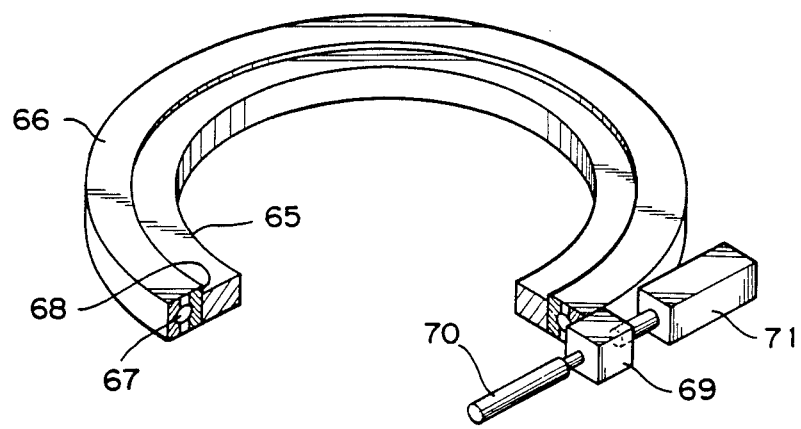
FIG. 16 is a schematic view showing one example of a rotational mechanism of the mask stage.

Referring to FIG. 16, there will be described a mechanism for rendering the mask stage 14 a degree of freedom in the θ-axis direction (rotational direction). The ring-shaped fixed member 65 is attached with a ring-shaped movable member 66 through a ball bearing 67, and a step 68 is formed between the fixed member 65 and the movable member 66. The fixed member 56 shown in FIG. 12 is mounted on the ring-shaped movable member 66. By driving a projection 69 which is integral with the ring-shaped movable member 66 by means of a piezoelectric device 70, the ring-shaped movable member 66 can be rotated, and the degree of freedom in the θ-axis direction of the mask stage 14 can be provided. Reference numeral 71 denotes a position detector. In a case where the movable range by the piezoelectric device 70 is too small, three piezoelectric devices may be combined so as to perform the measuring worm type motion as shown in FIG. 15.

Figure 17:
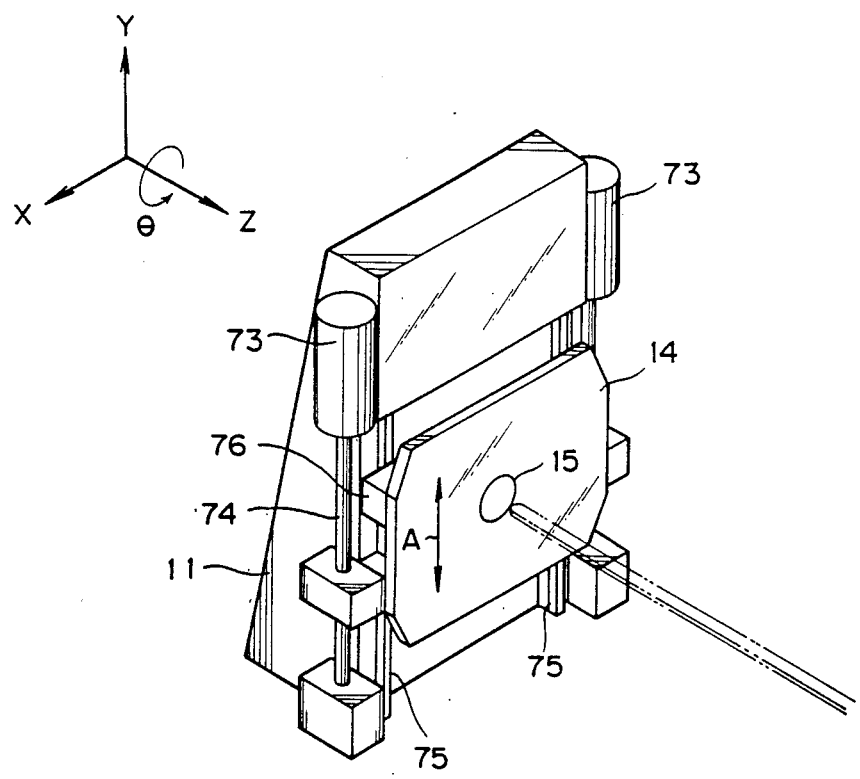
FIG. 17 is a schematic perspective view of a scanning mechanism for scanning the mask stage having a wafer integrally mounted thereon in the vertical direction with respect to SR.

Referring to FIG. 17, there will be described a scanning mechanism with respect to SR. While strictly maintaining the relative position between the mask 15 mounted on the mask stage 14 and the wafer (not shown), the mask stage 14 is scanned in the vertical direction (the direction, indicated by the arrow A) during SR exposure by a driving mechanism using a servo-motor 73 and a ball screw 74. The direction A is parallel to the Y-axis and thus perpendicular to the direction of irradiation which is parallel to the Z-axis and perpendicular to the direction of elongation of the SR beam which is parallel to the X-axis. Thus, the direction A may be referred to as the perpendicular direction. As a guide mechanism during scanning, a pair of guide rails 75 are engaged with pair of linear guides 76 so that lateral movement of the mask stage 14 can be prevented during scanning. The positional detection of the mask stage 14 during scanning is performed by a rotary encoder directly connected with the servo-motor 73. Thus, by scanning the mask stage 14 integrally with the wafer in the perpendicular direction, SR can be irradiated to the whole exposing area of the mask. As SR has generally parallel rays, a pattern of the mask transferred onto the wafer has an image generally as large as the original.

Figure 18:
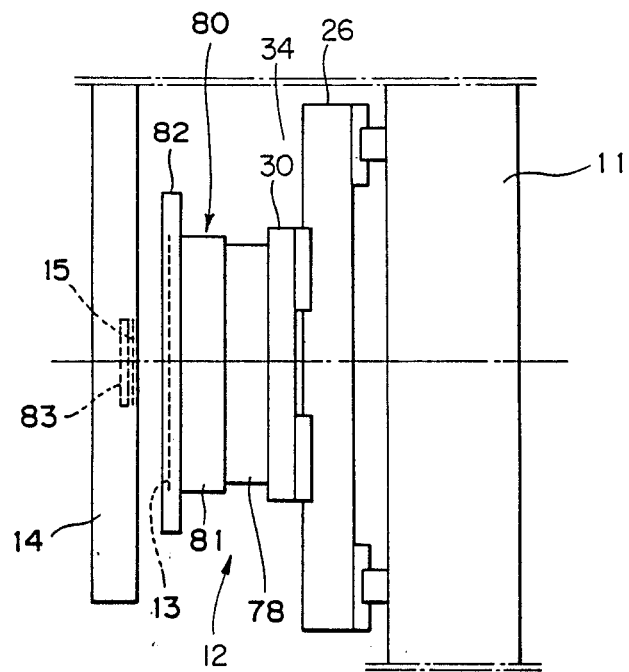
FIG. 18 is a top view of a wafer transfer mechanism according to one embodiment of the present invention.

Next, referring to FIGS. 18 through 21C, there will be described a preferred wafer transfer mechanism of the present invention for transferring a wafer from the wafer stage 12 to the mask stage 14. Referring to FIG. 18, a transfer member 78 is mounted for lateral movement on the coarse X-Y stage 34. In turn, a wafer mounting member 80 is mounted on the transfer member 78 so that the wafer mounting member 80 can move between a first position mounted on the coarse X-Y stage 34 through the transfer member 78 to a second position separated from the transfer member 78 and attracted to the mask stage 14. The wafer mounting member 80 is provided with a fine X-Y stage 81, a wafer chuck (not shown) for vacuum drawing and fixing the wafer 13, and a suction portion 82 disposed on the outer periphery of the wafer chuck and adapted to be vacuum drawn and fixed to the mask stage 14. Further, the mask 15 is removably attached to the mask stage 14 which is provided with a fine Z-θ stage 83 for moving the mask 15 in the irradiating direction of SR (parallel to the Z-axis) and rotating the mask 15 in a plane perpendicular to the irradiating direction of SR.

Figure 19A:
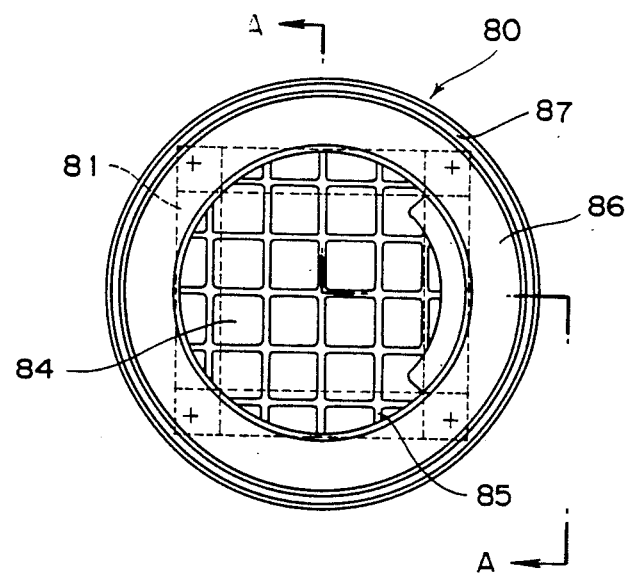
FIG. 19A is a front view of a wafer mounting member.
Figure 19B:
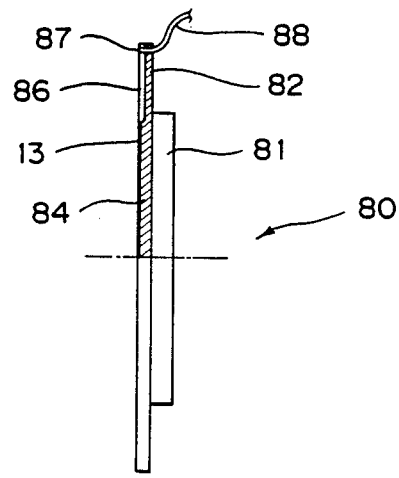
FIG. 19B is a sectional view taken along line A—A of FIG. 19A.

Referring to FIGS. 19A and 19B, the wafer mounting member 80 will be described in detail. The wafer mounting member 80 is provided at its front side with a wafer chuck 84 having a suction groove 85 for fixing the wafer 13 by means of vacuum attraction and at its reverse side with a fine X-Y stage 81. The suction portion 82 disposed on the outer periphery of the wafer chuck 84 comprises an annular concave portion 86 and an annular suction groove 87. The annular suction groove 87 is connected with a vacuum suction means through a conduit 88.

Figure 20A:
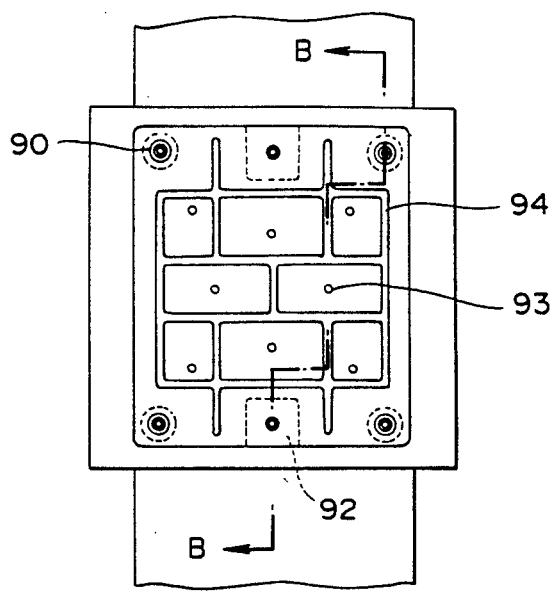
FIG. 20A is a front view of a transfer member.
Figure 20B:
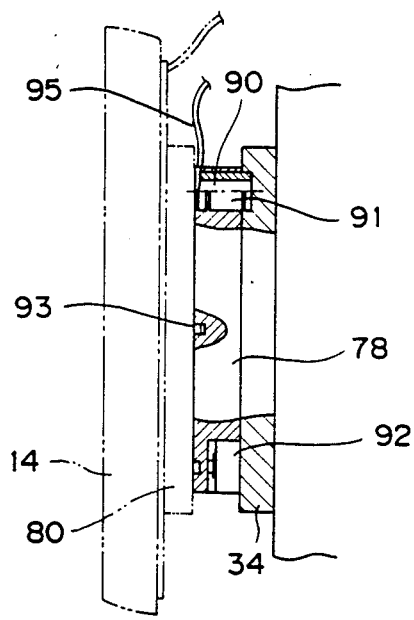
FIG. 20B is a sectional view taken along line B—B of FIG. 20A.

Referring to FIGS. 20A and 20B showing the transfer mechanism in detail, wherein a plurality of guide pins 90 are attached to the coarse X-Y stage 34, and these guide pins 90 are engaged with the transfer member 78 through linear ball bearings 91. Further, the coarse X-Y stage 34 is connected to one end of each of a pair of air cylinders 92, and the other ends of the air cylinders 92 are connected to the transfer member 78. Furthermore, the wafer mounting member 80 is provided with a plurality of position indexing plungers 93 which are air pressure operated. These plungers 93 are driven so as to be selectively engageable with the transfer member 78. Reference numeral 94 denotes a vacuum suction groove for drawing the wafer mounting member 80. The vacuum suction groove 94 is connected with a vacuum suction means through a conduit 95.

Figure 21A:
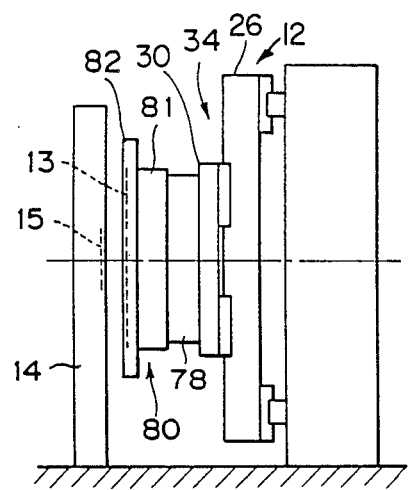
Figure 21B:
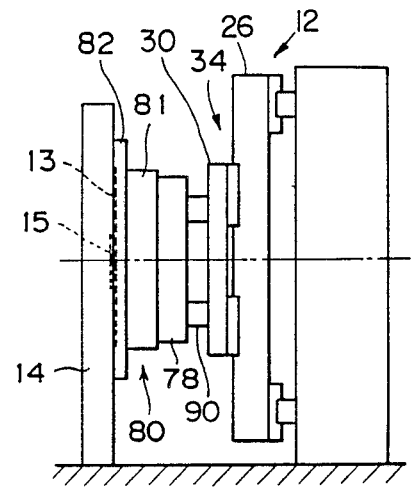

Next, referring to FIGS. 21A through 21C, the operation of the transfer mechanism and the wafer exposing steps will be described. The wafer stage 12 of this embodiment comprises the coarse X-Y stage 34, the transfer member 78, and the wafer mounting member 80 having the fine X-Y stage 81 mounted thereon. First, as shown in FIG. 21A, the coarse X-Y stage 34 is steppingly moved to correctly position a predetermined region of the wafer 13 with respect to the mask 15. At this time, the wafer mounting member 80 is vacuum drawn to the transfer member 78. Upon driving of the air cylinders 92 (FIGS. 20A and 20B), the transfer member 78 slides in the left-hand side of FIGS. 21A–21C guided by the guide pins 90, until and the wafer mounting member 80 abuts against the reverse side of the mask stage 14 as shown in FIG. 21B. Then, as shown in FIG. 21C, after the wafer mounting member 80 is vacuum drawn to the mask stage 14 by the suction portion 82, the transfer member 78 releases the vacuum attraction to the wafer mounting member 80 and is retracted to return to the coarse X-Y stage 34.

Figure 21C:
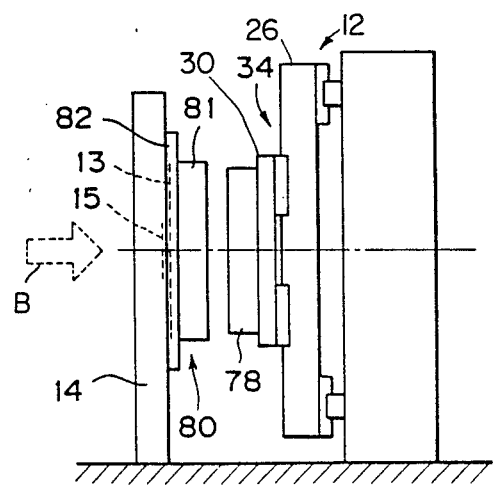

In the state of FIG. 21C, after the wafer 13 and the mask 15 are accurately positioned by the fine X-Y stage 81 and the fine Z-θ stage 83, the mask stage 14 is moved for scanning in the vertical direction while irradiating SR in the direction shown by an arrow B, so that the circuit pattern on the mask would be transferred onto the wafer. During exposure, the wafer 13 and the mask 15 are not intimately contacted each other but they are placed opposite each other with a very small space left therebetween.

According to the above-mentioned embodiment, by virtue of the provision of the transfer member 78, the wafer mounting member 80 is not displaced by dead weight in the perpendicular (vertical) direction during transfer, and positioning work of the wafer and the mask can be efficiently performed.

Since various changes and modifications of the invention will occur to and can be made readily by those skilled in the art without departing from the concept of the invention, the invention is not to be taken as limited except by the scope of the appended claims.

For example, in the above described embodiments the present invention is explained as a vertical stepper wherein the mask and wafer are oriented vertically. However, the present invention is not limited to vertical steppers but applicable to other types of steppers as along as a wafer and a mask are disposed in a direction perpendicular to the irradiating direction of the synchrotron radiation. In a wide sense, however, the present invention is also applicable to other types of steppers which employ visible lights or ultraviolet radiation for exposure.

Further, means for attracting the wafer mounting member to the mask stage is not limited to the suction means, but other attracting means such as magnetic attracting means can be employed.

What is claimed is:

1. A stepper for transferring a circuit pattern formed on a mask onto a wafer by means of exposure, using a synchrotron radiation source to produce synchrotron radiation source to produce synchrotron radiation in an irradiating direction, said stepper comprising:
    a coarse X-Y stage for steppingly moving said wafer in a first plane perpendicular to the irradiating direction of said synchrotron radiation;
    a mask stage, having said mask mountable thereon in such a manner that said mask orients in a second plane perpendicular to the irradiating direction of said synchrotron radiation, adapted to be moved for scanning in the second plane perpendicular to the irradiating direction of said synchrotron radiation;
    scanning means for scanning said mask stage;
    a wafer mounting member having said wafer mountable thereon in such a manner that said wafer orients in a third plane perpendicular to the irradiating direction of said synchrotron radiation and movable between a first position mounted on said coarse X-Y stage and a second position mounted on said mask stage, said wafer mounting member including a fine X-Y stage;
    transfer means for moving said wafer mounting member between said first and second positions;
    first attracting means for attracting said wafer to said wafer mounting member; and
    second attracting means for attracting said wafer mounting member to said mask stage.

2. A stepper as claimed in claim 1, wherein said mask stage includes a fine Z-θ stage for moving said mask in the irradiating direction of said synchrotron radiation and rotating said mask in the second plane perpendicular to the irradiating direction of said synchrotron radiation.

3. A stepper as claimed in claim 1, wherein said transfer means includes
    a plurality of guide pins mounted on said coarse X-Y stage, said wafer mounting member engaged with and guided by said guide pins, and air cylinder means for moving said wafer mounting member, said air cylinder means attached at one end to said coarse X-Y stage and at another end to said wafer mounting means.

4. A stepper as claimed in claim 1, wherein said transfer means includes
   a transfer member;
   a plurality of guide pins mounted on said coarse X-Y stage and adapted to be engaged with said transfer member to guide said transfer member;
   air cylinder means for moving said transfer member, having one end attached to said coarse X-Y stage and another end attached to said transfer member; and
   third attracting means for selectively attracting said wafer mounting member to said transfer member.

5. A stepper as claimed in claim 4, further comprising a position indexing plunger, selectively engageable with said transfer member, disposed on said wafer mounting member.

6. A stepper as claimed in claim 1, wherein said fine X-Y stage comprises:
   a fine X-axis stage including a fine X-axis member movable in an X-axis direction perpendicular to the irradiating direction, first parallel plate spring guides for supporting said fine X-axis member, and a first piezoelectric device disposed in such a manner as to displace said fine X-axis member in the X-axis direction; and
   a fine Y-axis stage including a fine Y-axis member movable in a Y-axis direction perpendicular to the irradiating and X-axis directions, second parallel plate spring guides for supporting said fine Y-axis member, and a second piezoelectric device disposed in such a manner as to displace said fine Y-axis member in the Y-axis direction, said fine Y-axis stage being mounted on said fine X-axis stage.

7. A stepper as claimed in claim 1, wherein said fine X-Y stage includes
   a fine X-Y member movable in X-axis and Y-axis directions perpendicular to each other and to the irradiating direction;
   first, second, third and fourth parallel plate spring guide means for supporting said fine X-Y member; and
   first and second piezoelectric devices disposed in such a manner as to displace said fine X-Y member in the X-axis and Y-axis directions, respectively.

8. A stepper as claimed in claim 1, further including
   first compensating means for compensating dead weight of said coarse X-Y stage, and
   second compensating means for compensating dead weight of said mask stage when moved for scanning.

9. A vertical stepper for transferring a circuit pattern formed on a mask onto a wafer by means of exposure using a synchrotron radiation source producing synchrotron radiation in an irradiating direction, said vertical stepper comprising:
   a coarse X-Y stage for steppingly moving said wafer in vertical and horizontal directions in a plane perpendicular to the irradiating direction of said synchrotron radiation;
   a mask stage having said mask mountable thereon in such a manner that said mask orients in the vertical direction, said mask stage adapted to be moved for scanning in the vertical direction;
   scanning means for scanning said mask stage in the vertical direction;
   a wafer mounting member having said wafer mountable thereon in such a manner that said wafer orients in the vertical direction, said wafer mounting member movable in the horizontal direction between a first position mounted on said coarse X-Y stage and a second position mounted on said mask stage, said wafer mounting member including a fine X-Y stage;
   first suction means for vacuum drawing said wafer to said wafer mounting member;
   second suction means for vacuum drawing said wafer mounting member to said mask stage; and
   transfer means for moving said wafer mounting member between said first and second positions, said transfer means including
   a transfer member;
   a plurality of guide pins mounted on said coarse X-Y stage and adapted to be engaged with said transfer member to guide said transfer means;
   air cylinder means for moving said transfer member, having one end attached to said coarse X-Y stage and another end attached to said transfer member; and
   third suction means for selectively vacuum drawing said wafer mounting member to said transfer member.

10. A vertical stepper for transferring a circuit pattern formed on a mask onto a wafer by means of exposure using a synchrotron radiation source producing synchrotron radiation in an irradiating direction, said vertical stepper comprising:
    a coarse X-Y stage for steppingly moving said wafer in vertical and horizontal directions in a plane perpendicular to the irradiating direction of said synchrotron radiation;
    a mask stage having said mask mountable thereon in such a manner that said mask orients in the vertical direction, said mask stage adapted to be moved for scanning in the vertical direction;
    scanning means for scanning said mask stage in the vertical direction;
    a wafer mounting member having said wafer mountable thereon in such a manner that said wafer orients in the vertical direction, said wafer mounting member movable in the horizontal direction between a first position mounted on said coarse X-Y stage and a second position mounted on said mask stage, said wafer mounting member including a fine X-Y stage;
    first suction means for vacuum drawing said wafer to said wafer mounting member;
    second suction means for vacuum drawing said wafer mounting member to said mask stage;
    transfer means for moving said wafer mounting member between said first and second positions; and
    a position indexing plunger, selectively engageable with said transfer member, disposed on said wafer mounting member.

11. A vertical stepper for transferring a circuit pattern formed on a mask onto a wafer by means of exposure using a synchrotron radiation source producing synchrotron radiation in an irradiating direction, said vertical stepper comprising:
    a coarse X-Y stage for steppingly moving said wafer in vertical and horizontal directions in a plane perpendicular to the irradiating direction of said synchrotron radiation;

a mask stage having said mask mountable thereon in such a manner that said mask orients in the vertical direction, said mask stage adapted to be moved for scanning in the vertical direction;

scanning means for scanning said mask stage in the vertical direction;

a wafer mounting member having said wafer mountable thereon in such a manner that said wafer orients in the vertical direction, said wafer mounting member movable in the horizontal direction between a first position mounted on said coarse X-Y stage and a second position mounted on said mask stage, said wafer mounting member including a fine X-Y stage comprising:
- a fine X-axis stage including a fine X-axis member movable in an X-axis direction, first parallel plate spring guides for supporting said fine X-axis member, and a first piezoelectric device disposed in such a manner as to displace said fine X-axis member in the X-axis direction; and
- a fine Y-axis stage including a fine Y-axis member movable in a Y-axis direction, said parallel plate spring guides for supporting said fine Y-axis member, and a second piezoelectric device disposed in such a manner as to displace said fine Y-axis member in the Y-axis direction, said fine Y-axis stage being mounted on said fine X-axis stage;

first suction means for vacuum drawing said wafer to said wafer mounting member;

second suction means for vacuum drawing said wafer mounting member to said mask stage; and transfer means for moving said wafer mounting member between said first and second positions.

12. A vertical stepper for transferring a circuit pattern formed on a mask onto a wafer by means of exposure using a synchrotron radiation source producing synchrotron radiation in an irradiating direction, said vertical stepper comprising:

a coarse X-Y stage for steppingly moving said wafer in vertical and horizontal directions in a plane perpendicular to the irradiating direction of said synchrotron radiation;

a mask stage having said mask mountable thereon in such a manner that said mask orients in the vertical direction, said mask stage adapted to be moved for scanning in the vertical direction;

scanning means for scanning said mask stage in the vertical direction;

a wafer mounting member having said wafer mountable thereon in such a manner that said wafer orients in the vertical direction, said wafer mounting member movable in the horizontal direction between a first position mounted on said coarse X-Y stage and a second position mounted on said mask stage, said wafer mounting member including a fine X-Y stage comprising:
- a fine X-Y member movable in mutually perpendicular X-axis and Y-axis directions;
- first, second, third and fourth parallel plate spring guide means for supporting said fine X-Y member; and
- first and second piezoelectric devices disposed in such a manner as to displace said first X-Y member in the X-axis and Y-axis directions, respectively;

first suction means for vacuum drawing said wafer to said wafer mounting member;

second suction means for vacuum drawing said wafer mounting member to said mask stage; and transfer means for moving said wafer mounting member between said first and second positions.

13. A vertical stepper for transferring a circuit pattern formed on a mask onto a wafer by means of exposure using a synchrotron radiation source producing synchrotron radiation in an irradiating direction, said vertical stepper comprising:

a coarse X-Y stage for steppingly moving said wafer in vertical and horizontal directions in a plane perpendicular to the irradiating direction of said synchrotron radiation;

a mask stage having said mask mountable thereon in such a manner that said mask orients in the vertical direction, said mask stage adapted to be moved for scanning in the vertical direction;

scanning means for scanning said mask stage in the vertical direction;

a wafer mounting member having said wafer mountable thereon in such a manner that said wafer orients in the vertical direction, said wafer mounting member movable in the horizontal direction between a first position mounted on said coarse X-Y stage and a second position mounted on said mask stage, said wafer mounting member including a fine X-Y stage;

first suction means for vacuum drawing said wafer to said wafer mounting member;

second suction means for vacuum drawing said wafer mounting member to said mask stage;

transfer means for moving said wafer mounting member between said first and second positions;

first compensating means for compensating dead weight of said coarse X-Y stage; and second compensating means for compensating dead weight of said mask stage when moved for scanning.

* * * * *

UNITED STATES PATENT AND TRADEMARK OFFICE
CERTIFICATE OF CORRECTION

PATENT NO. : 4,979,195

DATED : December 18, 1990

INVENTOR(S) : Tabata et al.

It is certified that error appears in the above-identified patent and that said Letters Patent is hereby corrected as shown below:

Title page, [54], before "VERTICAL STEPPER" insert --SYNCHROTON STEP AND REPEAT EXPOSURE--;

Col. 1, line 1, before "VERTICAL STEPPER" insert --SYNCHROTON STEP AND REPEAT EXPOSURE--;
line 18, delete "of".

Col. 2, line 61, after "a" insert --fine--.

Col. 4, line 30, after "Y-axis" insert --directions--.

Col. 5, line 6, "arm type" should be --arm-type--.

Col. 6, line 45, after "The" insert --fine--;
line 48, delete "is".

Col. 9, line 50, "in" should be --toward--;
line 50, "21C" should be --21C,--;
line 51, delete "and".

Col. 10, line 31, delete "source to produce synchrotron radiation".

Signed and Sealed this

Eighth Day of December, 1992

Attest:

DOUGLAS B. COMER

Attesting Officer

Acting Commissioner of Patents and Trademarks